United States Patent
Lim et al.

(10) Patent No.: US 7,364,275 B2
(45) Date of Patent: Apr. 29, 2008

(54) PIEZOELECTRIC ACTUATOR OF AN INK-JET PRINTHEAD AND METHOD FOR FORMING THE SAME

(75) Inventors: Seung-mo Lim, Yongin-si (KR); Jae-woo Chung, Suwon-si (KR); Jae-chang Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 295 days.

(21) Appl. No.: 10/805,430

(22) Filed: Mar. 22, 2004

(65) Prior Publication Data

US 2004/0246313 A1    Dec. 9, 2004

(30) Foreign Application Priority Data

Mar. 20, 2003    (KR) .................. 10-2003-0017388

(51) Int. Cl.
*B41J 2/45*     (2006.01)
*H01L 41/24*    (2006.01)
*H01L 41/08*    (2006.01)

(52) U.S. Cl. ................... 347/70; 310/324; 29/25.35

(58) Field of Classification Search .............. 347/70
See application file for complete search history.

(56) References Cited

U.S. PATENT DOCUMENTS

| | | | | |
|---|---|---|---|---|
| 5,530,465 A * | 6/1996 | Hasegawa et al. | ............ | 347/70 |
| 5,802,686 A * | 9/1998 | Shimada et al. | ............ | 29/25.35 |
| 5,825,121 A * | 10/1998 | Shimada | ............ | 29/25.35 |
| 5,856,837 A * | 1/1999 | Kitahara et al. | ............ | 347/70 |
| 5,929,881 A * | 7/1999 | Kitahara et al. | ............ | 347/70 |
| 5,956,829 A | 9/1999 | Kitahara et al. | ............ | 29/25.35 |
| 5,984,458 A * | 11/1999 | Murai | ............ | 347/68 |
| 6,132,035 A * | 10/2000 | Kutami et al. | ............ | 347/70 |
| 6,198,203 B1 | 3/2001 | Hotomi | | |
| 6,265,139 B1 | 7/2001 | Yun et al. | | |
| 6,332,254 B1 * | 12/2001 | Usui et al. | ............ | 29/25.35 |
| 6,336,717 B1 * | 1/2002 | Shimada et al. | ............ | 347/71 |
| 6,361,152 B1 * | 3/2002 | Fujisawa | ............ | 347/68 |
| 6,454,395 B1 * | 9/2002 | Irinoda | ............ | 347/54 |
| 7,001,014 B2 * | 2/2006 | Torii et al. | ............ | 347/72 |

FOREIGN PATENT DOCUMENTS

| | | |
|---|---|---|
| EP | 0 782 923 A1 | 7/1997 |
| EP | 1 067 609 A1 | 1/2001 |
| JP | 12-196163 | 7/2000 |

* cited by examiner

*Primary Examiner*—Matthew Luu
*Assistant Examiner*—Shelby Fidler
(74) *Attorney, Agent, or Firm*—Lee & Morse, P.C.

(57) ABSTRACT

A piezoelectric actuator for providing a driving force to a pressure chamber of an ink-jet printhead for ejecting ink by deforming a vibration plate, the vibration plate forming an upper wall of the pressure chamber, the piezoelectric actuator including a lower electrode formed on the vibration plate, a piezoelectric film having either: (a) peripheral portions, the piezoelectric film formed on the lower electrode at a position that corresponds to the pressure chamber and having a space between the peripheral portions and the lower electrode, or (b) a lateral surface, the piezoelectric film formed on the lower electrode at a position that corresponds to the pressure chamber, the lateral surface of the piezoelectric film substantially forming a right angle with respect to a top surface of the lower electrode, and an upper electrode formed on the piezoelectric film for applying a voltage to the piezoelectric film.

15 Claims, 11 Drawing Sheets

PIEZOELECTRIC ACTUATOR OF AN INK-JET PRINTHEAD AND METHOD FOR FORMING THE SAME

BACKGROUND OF THE INVENTION

1. Field of the Invention

The present invention relates to a piezoelectric ink-jet printhead. More particularly, the present invention relates to a piezoelectric actuator that provides a driving force for ejecting ink in a piezoelectric ink-jet printhead, and a method for forming the piezoelectric actuator.

2. Description of the Related Art

Typically, ink-jet printheads are devices for printing a predetermined color image by ejecting a small volume droplet of printing ink at a desired position on a recording sheet. In ink-jet printheads, ink ejection mechanisms may be generally categorized into two types. A first type is a thermally driven type, in which a heat source is employed to generate bubbles in ink to cause ink droplets to be ejected by an expansion force of the generated bubbles. A second type is a piezoelectrically driven type, in which ink is ejected by a pressure applied to the ink due to a deformation of a piezoelectric element.

Figure 1A:
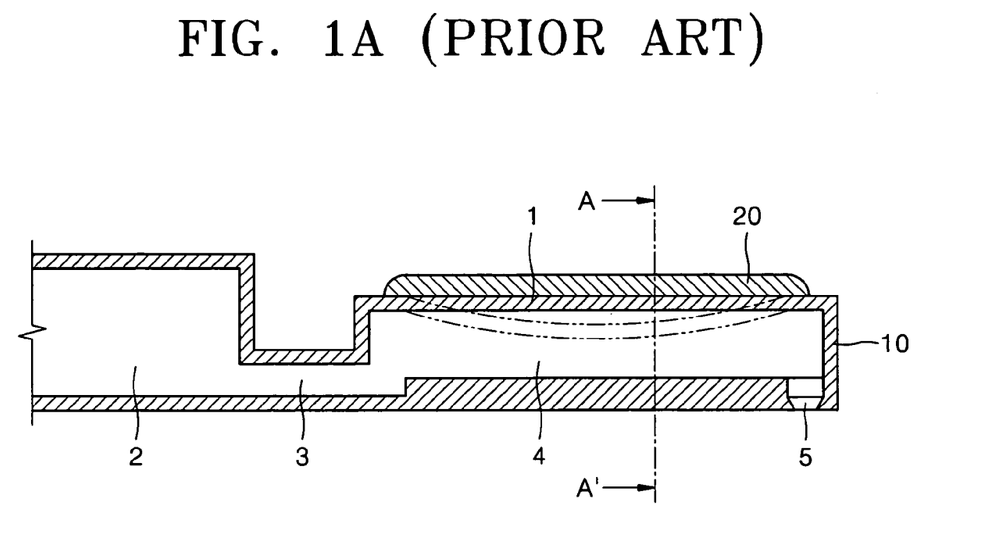
FIG. 1A illustrates a schematic diagram of a conventional ink-jet printhead.

FIG. 1A illustrates a schematic diagram of a conventional ink-jet printhead. Referring to FIG. 1A, a reservoir 2, a restrictor 3, a pressure chamber 4 and a nozzle 5 are formed in a passage forming plate 10. The reservoir 2, the restrictor 3, the pressure chamber 4 and the nozzle 5 are in flow communication and form an ink passage. A piezoelectric actuator 20 is provided on the passage forming plate 10. The reservoir 2 stores ink supplied from an ink container (not shown). The restrictor 3 is a passage through which the ink passes from the reservoir 2 to the pressure chamber 4. The pressure chamber 4 is filled with ink to be ejected and varies in volume as the piezoelectric actuator 20 is driven, thereby causing a change in pressure for ejecting or drawing in the ink. To this end, a portion of the passage forming plate 10 that forms an upper wall of the pressure chamber 4 serves as a vibration plate 1, which is deformed by the piezoelectric actuator 20.

The above-described conventional piezoelectric ink-jet printhead operates as follows. When the vibration plate 1 deforms due to a driving of the piezoelectric actuator 20, the volume of the pressure chamber 4 decreases, causing a change in a pressure within the pressure chamber 4, so that ink in the pressure chamber 4 is ejected through the nozzle 5. Then, when the vibration plate 1 is restored to an original shape thereof as the piezoelectric actuator 20 is driven, the volume of the pressure chamber 4 increases, causing a change in the volume, so that the ink stored in the reservoir 2 is drawn into pressure chamber 4 through the restrictor 3.

Figure 1B:
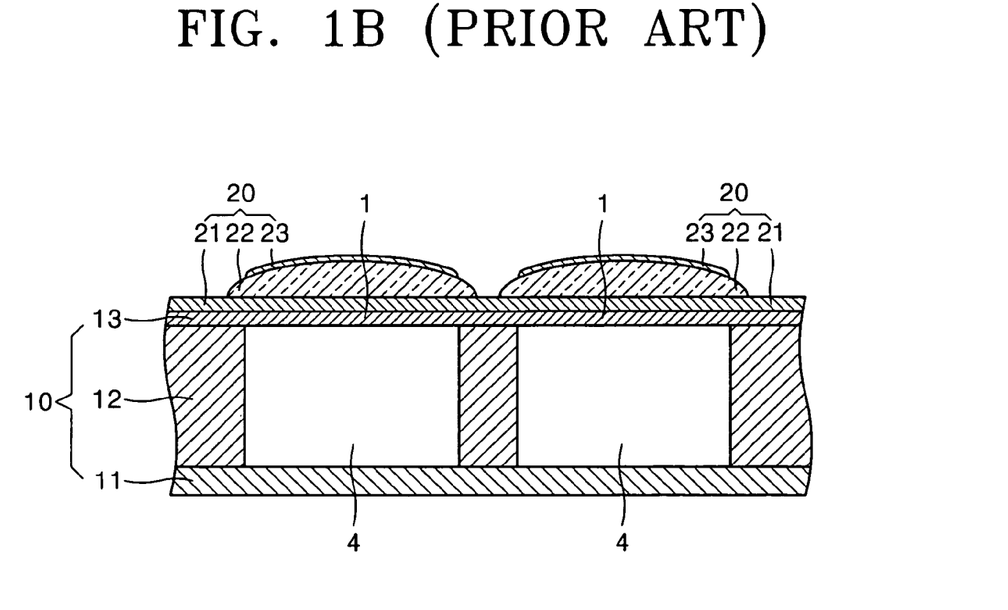
FIG. 1B illustrates a cross-sectional view of a conventional piezoelectric actuator taken along line A-A' of FIG. 1A.

FIG. 1B illustrates a cross-sectional view of a conventional piezoelectric actuator taken along line A-A' of FIG. 1A. Referring to FIG. 1B, the passage forming plate 10 is formed by fabricating a plurality of thin plates 11, 12, and 13, which may be formed of ceramics, metals, synthetic resin or silicon substrates or plastics, forming a portion of the ink passage, and then stacking and adhering the plurality of thin plates 11, 12, and 13 using an adhesive. As such, an upper plate 13, which is stacked above the pressure chamber 4, serves as the vibration plate 1. The piezoelectric actuator 20 includes a lower electrode 21, a piezoelectric film 22 and an upper electrode 23, which are sequentially stacked on the vibration plate 1. The lower electrode 21 is formed by sputtering a predetermined metal material on the vibration plate 1. The piezoelectric film 22 is formed by applying a paste-state ceramic material on the lower electrode 21 to a predetermined thickness by screen-printing and sintering the same. The upper electrode 23 is formed by applying a conductive material onto a surface of the piezoelectric film 22 by screen-printing or depositing by means of a sputterer, an evaporator or an E-beam irradiator.

However, since the piezoelectric film 22 formed by the conventional screen-printing method spreads laterally in view of paste-state material characteristics, it is more difficult to obtain a correctly sized, rectangular-shaped film. That is, the formed piezoelectric film 22 is thick at a middle portion thereof and thin at edge portions thereof. In an effort to remedy such a problem, conventionally, the upper electrode 23 is formed only on the thick, middle portion, and not on the thin, peripheral portions of the piezoelectric film 22. Even slight misplacement of the upper electrode 23 on the piezoelectric film 22 may result in a short between the upper electrode 23 and the lower electrode 21. After the piezoelectric film 22 is sintered, an electric field is applied to the piezoelectric film 22 to produce piezoelectric characteristics, which is called a polling process. In the polling process, a high electric field of about 10 kV/cm is applied between the upper electrode 23 and the lower electrode 21. If the upper electrode 23 is formed at the thin, peripheral portions of the piezoelectric film 22, a gap between the upper electrode 23 and the lower electrode 21 is reduced so that breakdown occurs, which causes cracking of the piezoelectric film 22 or adversely affects piezoelectric characteristics of the piezoelectric film 22.

To address these problems, the upper electrode 23 is formed only on the thick, middle portion of the piezoelectric film 22, rather than on the thin, peripheral portions. Thus, a width of the upper electrode 23 becomes much smaller than that of the piezoelectric film 22. As a result, the piezoelectric film 22 cannot sufficiently produce piezoelectric effects.

To obtain improved print quality, i.e., high resolution and fast printing, it becomes necessary to increase a nozzle density. To this end, a size of the pressure chamber 4 and a distance between adjacent pressure chambers 4 should be reduced, and a width of the piezoelectric film 22 should be reduced accordingly. If the width of the piezoelectric film 22 is reduced, however, it is more difficult to form the upper electrode 23 on the piezoelectric film 22 by the conventional piezoelectric actuator formation method, which impedes formation of the piezoelectric actuator 20. Conventionally, the margin of a line width is generally about 50 μm.

SUMMARY OF THE INVENTION

The present invention provides a piezoelectric actuator for an ink-jet printhead, which can form a wider upper electrode, as compared to conventional structures, to provide sufficient piezoelectric effects and can prevent breakdown of a piezoelectric film during a polling or driving process, and a method for manufacturing the same.

According to a feature of the present invention, one embodiment of the present invention provides a piezoelectric actuator for providing a driving force to a pressure chamber of an ink-jet printhead for ejecting ink by deforming a vibration plate, the vibration plate forming an upper wall of the pressure chamber, the piezoelectric actuator including a lower electrode formed on the vibration plate, a piezoelectric film having peripheral portions, the piezoelectric film formed on the lower electrode at a position that corresponds to the pressure chamber and having a space between the peripheral portions and the lower electrode, and an upper electrode formed on the piezoelectric film for applying a voltage to the piezoelectric film. A width of a portion of the piezoelectric film contacting the lower electrode may be about 70 to about 90% of a width of the pressure chamber.

Another embodiment of the present invention provides a piezoelectric actuator for providing a driving force to a pressure chamber of an ink-jet printhead for ejecting ink by deforming a vibration plate, the vibration plate forming an upper wall of the pressure chamber, the piezoelectric actuator including a lower electrode formed on the vibration plate, a piezoelectric film having a lateral surface, the piezoelectric film formed on the lower electrode at a position that corresponds to the pressure chamber, the lateral surface of the piezoelectric film substantially forming a right angle with respect to a top surface of the lower electrode, and an upper electrode formed on the piezoelectric film for applying a voltage to the piezoelectric film. The piezoelectric film may have a rectangular section having a constant height. A width of the piezoelectric film may be about 70 to about 90% of a width of the pressure chamber. A width of the upper electrode may be substantially equal to a width of the piezoelectric film.

In a piezoelectric actuator according to either embodiment of the present invention, the lower electrode may include a two-layer structure in which a titanium (Ti) layer and a platinum (Pt) layer are sequentially stacked. The titanium (Ti) layer may have a thickness of about 400 Å and the platinum (Pt) layer may have a thickness of about 5000 Å. The vibration plate may be silicon and the piezoelectric actuator may further include a silicon oxide layer between the vibration plate and the lower electrode.

According to another feature of the present invention, one embodiment of the present invention provides a method for forming a piezoelectric actuator for providing a driving force to a pressure chamber of an ink-jet printhead for ejecting ink by deforming a vibration plate, the vibration plate forming an upper wall of the pressure chamber, the method including forming a lower electrode on the vibration plate, coating a photoresist on an entire surface of the lower electrode to a predetermined thickness, forming an opening at a position corresponding to the pressure chamber by patterning the photoresist, forming a piezoelectric film having peripheral portions by coating a piezoelectric material on the lower electrode exposed by the opening, the piezoelectric film having a width greater than a width of the opening, forming an upper electrode on the piezoelectric film, forming a space between the peripheral portions of the piezoelectric film and the lower electrode by removing the photoresist, sintering the piezoelectric film, and applying an electric field to the piezoelectric film to perform polling to provide piezoelectric characteristics. A thickness of the photoresist coated may be about 2 to 8 μm.

Another embodiment of the present invention provides a method for forming a piezoelectric actuator for providing a driving force to a pressure chamber of an ink-jet printhead for ejecting ink by deforming a vibration plate, the vibration plate forming an upper wall of the pressure chamber, the method including forming a lower electrode on the vibration plate, coating a photoresist on an entire surface of the lower electrode to a predetermined thickness, forming an opening at a position corresponding to the pressure chamber by patterning the photoresist, forming a piezoelectric film having a lateral surface substantially forming a right angle with respect to a top surface of the lower electrode by coating an piezoelectric material within the opening, forming an upper electrode on the piezoelectric film entirely within the opening, removing the photoresist, sintering the piezoelectric film, and applying an electric field to the piezoelectric film to perform polling to provide piezoelectric characteristics. A thickness of the photoresist coated may be about 20 to 40 μm. The piezoelectric film may have a rectangular section having a constant height. The upper electrode may have a width substantially equal to a width of the piezoelectric film.

In a method for forming a piezoelectric actuator according to either embodiment of the present invention, a width of the opening may be about 70 to 90% of a width of the pressure chamber. The piezoelectric material may be lead zirconate titanate (PZT) ceramics. Coating the piezoelectric material may include screen-printing. The pressure chamber and the vibration plate may be formed in a silicon substrate and the method may further include forming a silicon oxide layer between the silicon substrate and the lower electrode. Forming the lower electrode may include sequentially depositing a titanium (Ti) layer and a platinum (Pt) layer on the vibration plate, wherein depositing the titanium (Ti) layer may include depositing titanium (Ti) to a thickness of about 400 Å by sputtering and depositing the platinum (Pt) layer may include depositing platinum (Pt) to a thickness of about 5000 Å by sputtering. Forming the upper electrode may include printing an electrode material on the piezoelectric film and the electrode material may be an Ag—Pd paste. Alternatively, forming the upper electrode may include depositing an electrode material on the piezoelectric film by one means selected from the group consisting of a sputterer, an evaporator, and an E-beam irradiator.

As described above, according to the various embodiments of the present invention, a wider upper electrode can be formed, thereby producing sufficient piezoelectric effects and preventing breakdown of the piezoelectric film during polling or driving.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2003-17388, filed on Mar. 20, 2003, and entitled, "Piezoelectric Actuator of an Ink-Jet Printhead and Method for Forming the Same," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Like reference numerals refer to like elements throughout.

Figure 2:
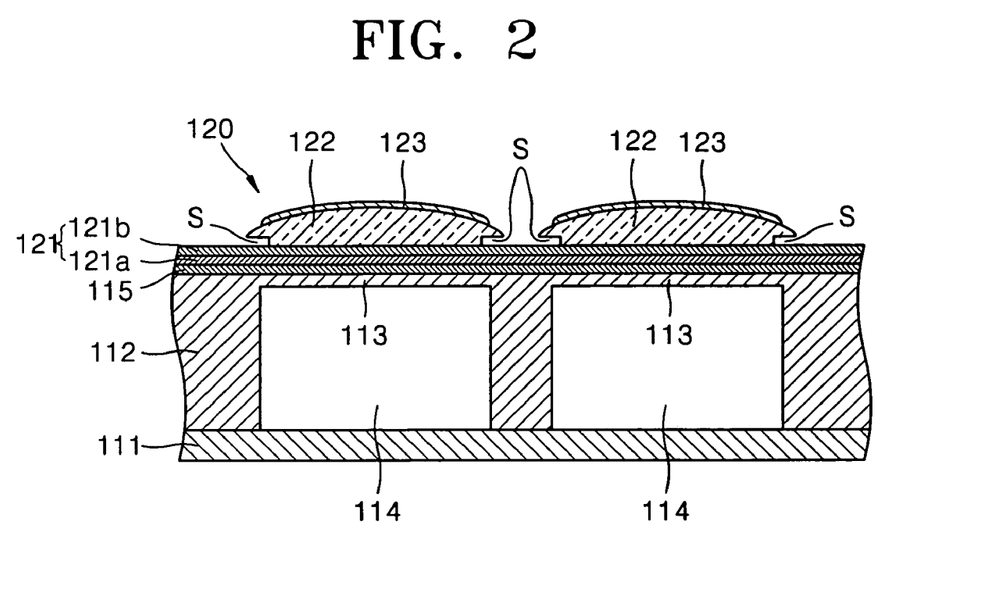
FIG. 2 illustrates a cross-sectional view illustrating a structure of a piezoelectric actuator for an ink-jet printhead according to a first embodiment of the present invention.

FIG. 2 illustrates a cross-sectional view of a structure of a piezoelectric actuator for an ink-jet printhead according to a first embodiment of the present invention.

Referring to FIG. 2, a piezoelectric actuator 120 of an ink-jet printhead according to a first embodiment of the present invention is formed on a vibration plate 113, which forms an upper wall of a pressure chamber 114. In operation, the piezoelectric actuator 120 deforms the vibration plate 113 to provide a driving force to the pressure chamber 114 for ejecting ink. The piezoelectric actuator 120 includes a lower electrode 121 serving as a common electrode, a piezoelectric film 122, which is deformable according to an application of a voltage, and an upper electrode 123 serving as a drive electrode. The lower electrode 121, the piezoelectric film 122 and the upper electrode 123 are sequentially stacked on the vibration plate 113.

As described above, the pressure chamber 114 to be filled with ink to be ejected and an ink passage (not shown) for supplying the pressure chamber 114 with ink and ejecting ink from the pressure chamber 114 are provided in the piezoelectric ink-jet printhead. The ink passage is formed on a plurality of plates including a base plate 111 and a chamber forming plate 112.

The lower electrode 121 is formed on the vibration plate 113. The lower electrode 121 may be formed of a single metal layer having a conductive property. More preferably, the lower electrode 121 is formed of two, sequentially stacked, metal layers of titanium (Ti) 121a and platinum (Pt) 121b, as shown FIG. 2. The Ti/Pt layers 121a and 121b serve as not only a common electrode but also a diffusion barrier layer for preventing inter-diffusion between the piezoelectric film 122 and the vibration plate 113.

In a case where the vibration plate 113 is made of silicon, a silicon oxide layer 115 as an insulating layer may be formed between the vibration plate 113 and the lower electrode 121. The silicon oxide layer 115 serves not only as an insulating layer but also functions to suppress inter-diffusion and thermal stress between the vibration plate 113 and the lower electrode 121.

The piezoelectric film 122, which has peripheral portions, is formed on the lower electrode 121 and disposed at a position corresponding to the pressure chamber 114. A space S having a predetermined width and height is formed between peripheral portions of the piezoelectric film 122 and the lower electrode 121. Preferably, a distance between the spaces S formed at either peripheral portion of the piezoelectric film 122, i.e., a width of a portion of the piezoelectric film 122 contacting the lower electrode 121, is about 70 to about 90% of a width of the pressure chamber 114.

The upper electrode 123 is formed on the piezoelectric film 122 and serves as a drive electrode for applying a voltage to the piezoelectric film 122.

In the aforementioned piezoelectric actuator 120 of the ink-jet printhead according to the first embodiment of the present invention, since the space S, which has the predetermined width and height, is formed between peripherals portion of the piezoelectric film 122 and the lower electrode 121, even if the upper electrode 123 is formed to be wider than a conventional upper electrode, a short between the upper electrode 123 and the lower electrode 121 does not occur. Moreover, breakdown of the piezoelectric film 122 does not occur during polling or driving of the piezoelectric actuator 120. Thus, the piezoelectric actuator 120 according to the first embodiment of the present invention advantageously produces sufficient piezoelectric effects due to a relatively wide upper electrode 123.

Figure 3:
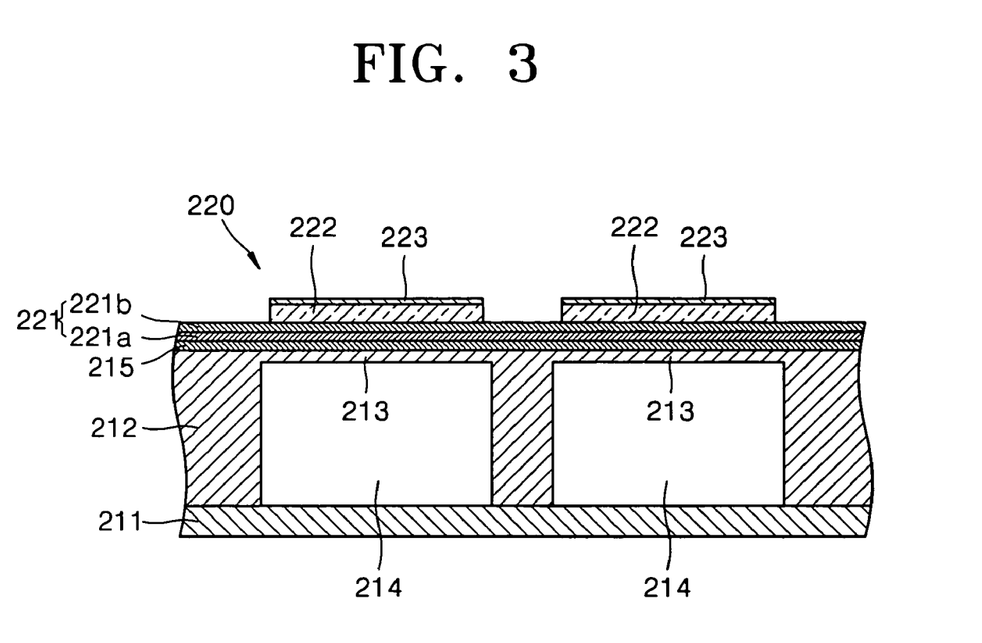
FIG. 3 illustrates a cross-sectional view of a structure of a piezoelectric actuator for an ink-jet printhead according to a second embodiment of the present invention.

FIG. 3 illustrates a cross-sectional view of a structure of a piezoelectric actuator for an ink-jet printhead according to a second embodiment of the present invention. The piezoelectric actuator of this embodiment is the same as that of the first embodiment, except with respect to a shape of the piezoelectric film. Thus, a detailed description of the same parts as those in the first embodiment will not be repeated.

Referring to FIG. 3, a piezoelectric actuator 220 of an ink-jet printhead according to the second embodiment of the present invention includes a lower electrode 221 serving as a common electrode, a piezoelectric film 222, which is deformable according to an application of a voltage, and an upper electrode 223 serving as a drive electrode. The lower electrode 221, the piezoelectric film 222 and the upper electrode 223 are sequentially stacked on a vibration plate 213.

A pressure chamber 214 and an ink passage (not shown) are formed on a plurality of plates having a base plate 211 and a chamber forming plate 212. The vibration plate 213 forms an upper wall of the pressure chamber 214.

The lower electrode 221 is formed on the vibration plate 213 and may be formed of two, sequentially stacked, metal layers of titanium (Ti) 221a and platinum (Pt) 221b, as shown in FIG. 3. The Ti/Pt layers 221a and 221b serve in the same way as in the first embodiment. In a case where the vibration plate 213 is made of silicon, as in the first embodiment, a silicon oxide layer 215 as an insulating layer may be formed between the vibration plate 213 and the lower electrode 221.

The piezoelectric film 222 is formed on the lower electrode 221 and disposed at a position corresponding to the pressure chamber 214. Further, a lateral surface of the piezoelectric film 222 forms substantially a right angle with respect to a top surface of the lower electrode 221. The piezoelectric film 222 preferably has a rectangular section having a constant height. In addition, a width of the piezoelectric film 222 is preferably about 70 to about 90% of a width of the pressure chamber 214.

The upper electrode 223 is formed on the piezoelectric film 222 and preferably has a width that is substantially equal to a width of the piezoelectric film 222.

In the aforementioned piezoelectric actuator 220 of the ink-jet printhead according to the second embodiment of the present invention, since the lateral surface of the piezoelectric film 222 forms substantially a right angle with respect to the top surface of the lower electrode 221, there is no thin peripheral portion in the piezoelectric film 222. Further, the piezoelectric film 222 has a rectangular section having a constant height. Thus, the width of the upper electrode 223 can be made substantially equal to the width of the piezoelectric film 222, thereby allowing the piezoelectric actuator 220 to produce maximum piezoelectric effects without causing a short between the upper electrode 223 and the lower electrode 221 or breakdown of the piezoelectric film 222. In addition, since the piezoelectric film 222 is thinly formed to have a predetermined thickness, a piezoelectric actuator 220 of relatively small size can be accurately formed and a distance between adjacent piezoelectric films 220 can be reduced. Thus, piezoelectric actuators 220 according to the second embodiment of the present invention may be densely arranged, thereby facilitating implementation of an ink-jet printhead having high resolution.

FIGS. 4A through 4D show analysis results of a displacement of a vibration plate depending on shapes of a piezoelectric film and an upper electrode. In each drawing, a structure of each piezoelectric actuator is shown on the left and an analysis result of the structure is shown on the right.

Figure 4A:
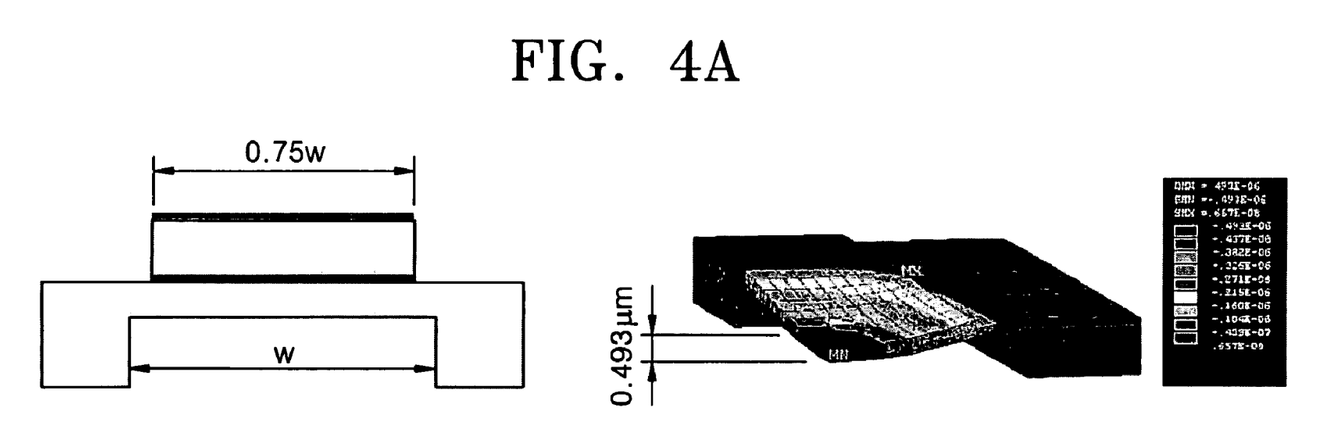
FIGS. 4A through 4D show analysis results of a displacement of a vibration plate depending on shapes of a piezoelectric film and an upper electrode.

In particular, FIG. 4A shows the analysis result of a displacement of a vibration plate in the piezoelectric actuator according to the second embodiment of the present invention. Here, the piezoelectric film has a rectangular section, and a width of the piezoelectric film and electrodes is about 75% of a width W of the pressure chamber. The analysis result shows that a displacement of the vibration plate deformable by the piezoelectric actuator is about 0.493 μm.

Figure 4B:
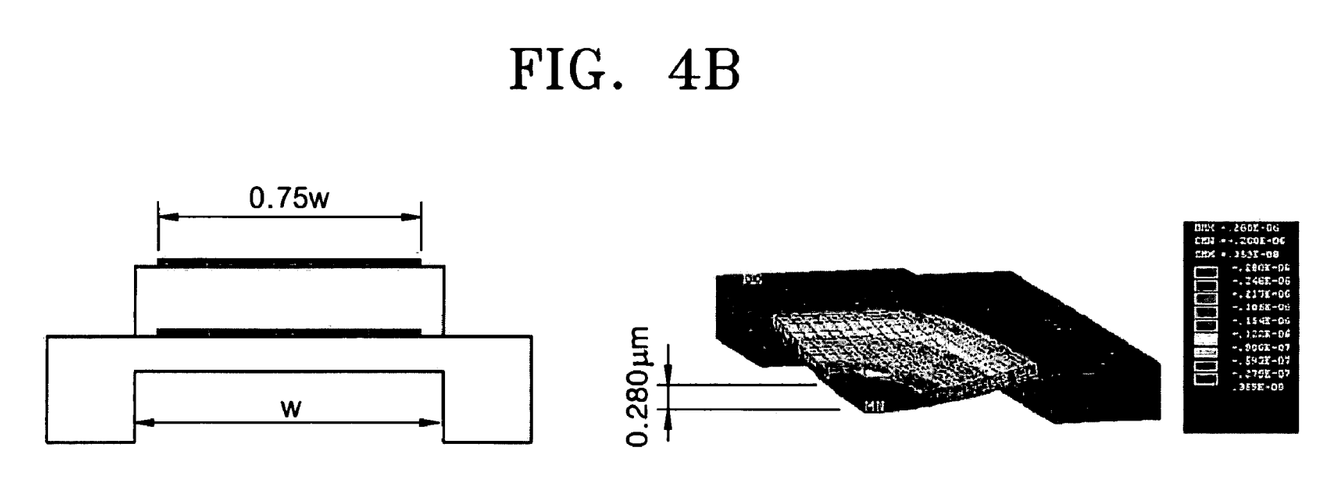

In FIG. 4B, a width of the piezoelectric film is the same as a width W of the pressure chamber and widths of the electrodes are about 75% of the width W of the pressure chamber. The analysis result shows that a displacement of the vibration plate deformable by the piezoelectric actuator is about 0.280 μm, which is about 57% of that in the case shown in FIG. 4A.

Figure 4C:
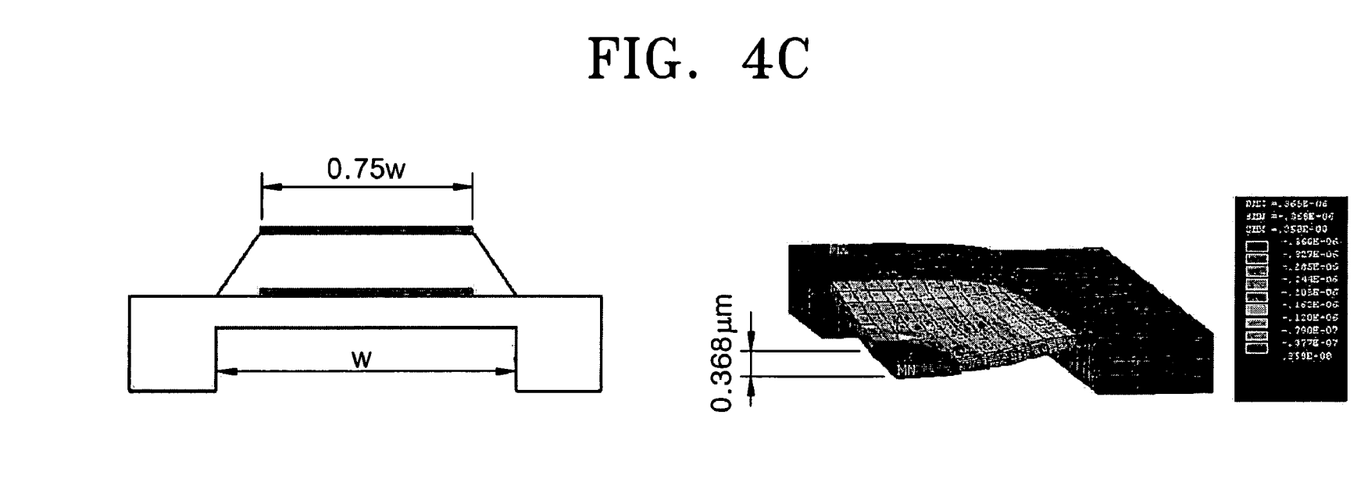

Referring to FIG. 4C, a piezoelectric film having thin peripheral portions has a width the same as a width W of the pressure chamber. The width of the electrodes is about 75% of the width W of the pressure chamber. The analysis result shows that a displacement of the vibration plate deformable by the piezoelectric actuator is about 0.368 μm, which is about 75% of that in the case shown in FIG. 4A.

Figure 4D:
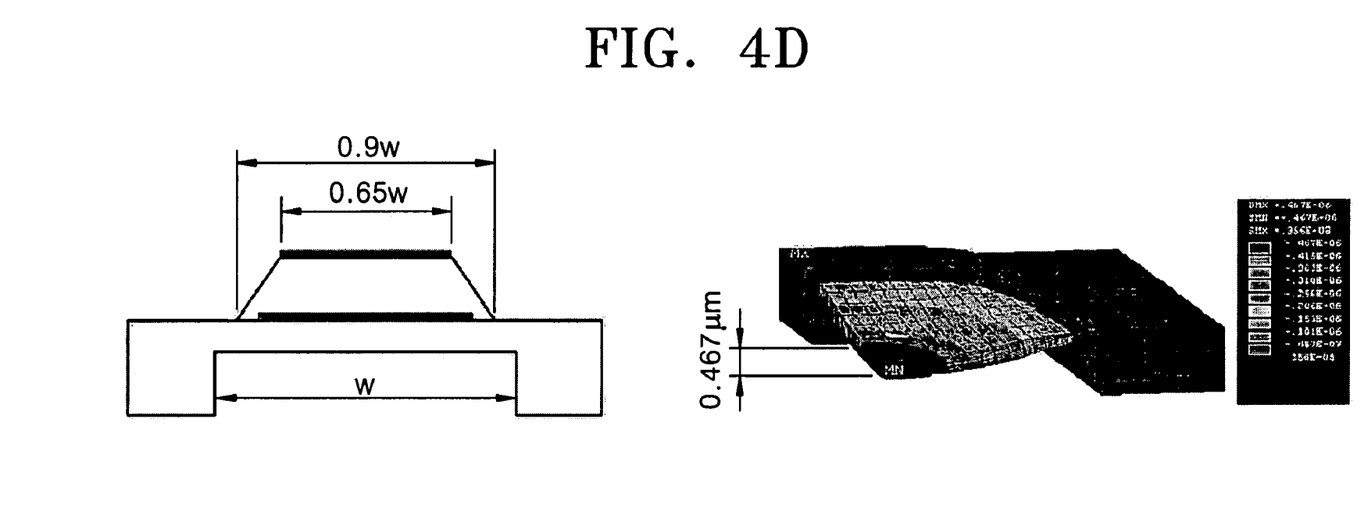

In FIG. 4D, a width of a piezoelectric film having thin peripheral portions is about 90% of a width W of the pressure chamber. A width of the upper electrode is about 65% of the width W of the pressure chamber. The analysis result shows that a displacement of the vibration plate deformable by the piezoelectric actuator is about 0.467 μm, which is about 94% of that in the case shown in FIG. 4A.

As described above, when the piezoelectric film has a rectangular section and a width thereof is smaller than that of the pressure chamber, the displacement of the vibration plate is largest. Therefore, as shown in FIG. 4A, the piezoelectric actuator according to the second embodiment of the present invention is able to efficiently vibrate the vibration plate. For the reasons stated above, in the piezoelectric actuator according to the first embodiment of the present invention, it is preferable that a width of a portion of the piezoelectric film contacting the lower electrode is narrower than a width of the pressure chamber.

FIGS. 5A through 5H illustrate sequential steps of a method of forming the piezoelectric actuator shown in FIG. 2.

Figure 5A:
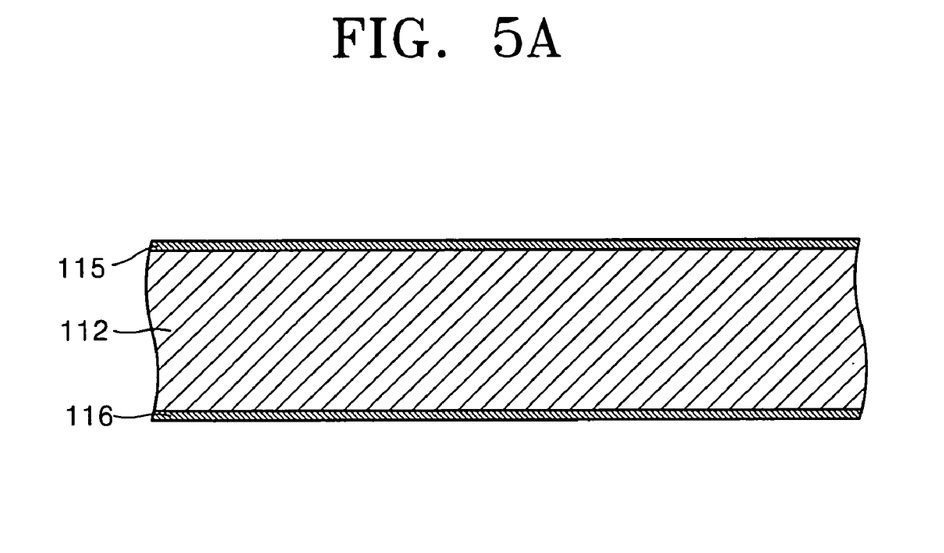
FIGS. 5A through 5H illustrate sequential steps of a method of forming the piezoelectric actuator shown in FIG. 2.
Figure 5B:
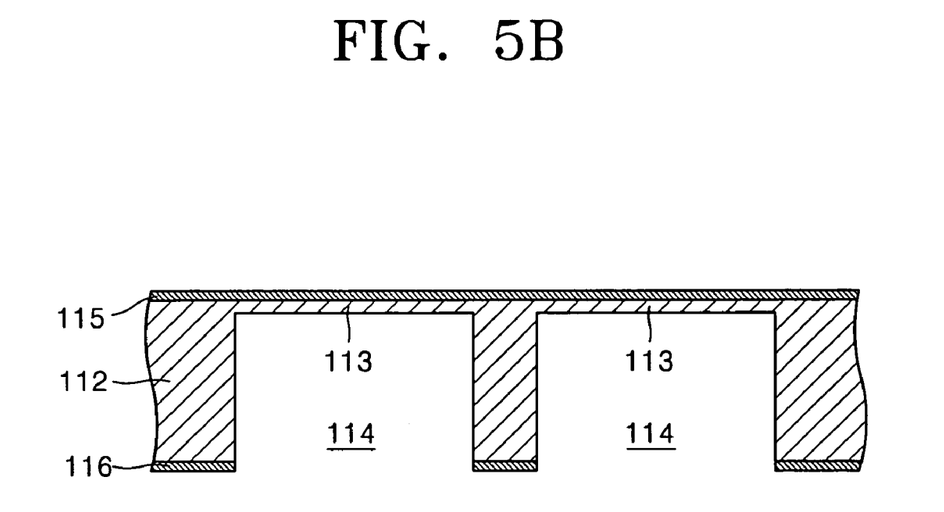

Referring initially to FIGS. 5A and 5B, the vibration plate 113, which forms an upper wall of the pressure chamber 114, may be formed by etching a silicon substrate 112 to a predetermined depth from a bottom surface of the silicon substrate 112 simultaneously with a formation of the pressure chamber 114. More specifically, as shown in FIG. 5A, the silicon substrate 112 is wet or dry oxidized in an oxidation furnace, thereby forming first and second silicon oxide layers 115 and 116, respectively.

Subsequently, as shown in FIG. 5B, the second silicon oxide layer 116, which is formed on a bottom of the silicon substrate 112, is patterned using a photoresist pattern to expose a portion of the silicon substrate 112, which will become a portion of the pressure chamber 114, and the exposed substrate 112 is dry or wet etched to a predetermined depth, thereby forming the pressure chamber 114. Here, a portion of the substrate 112 remaining after being etched forms the vibration plate 113.

The pressure chamber 114 and the vibration plate 113 may be formed by another known technology. For example, the pressure chamber 114 and the vibration plate 113 may be formed on different substrates. In this case, a separate substrate is adhered to a substrate through which the pressure chamber 114 is formed, thereby forming the vibration plate 113.

Figure 5C:
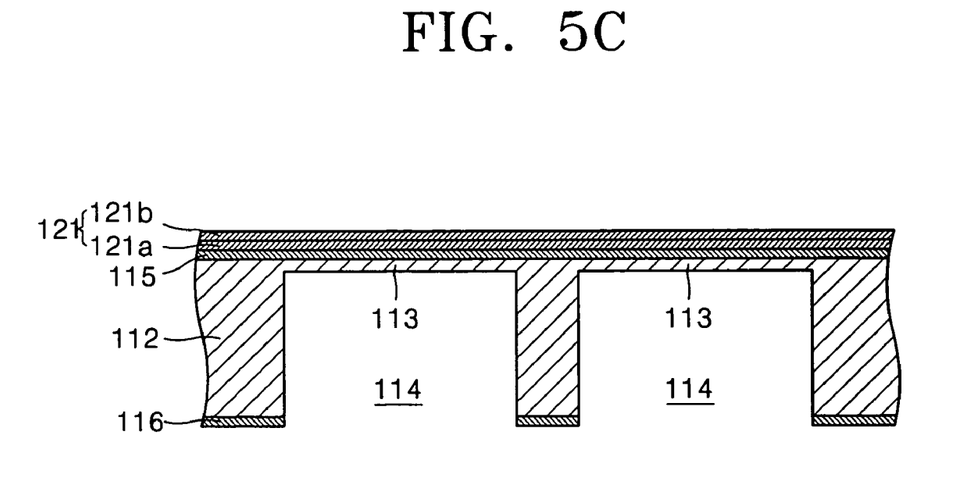

As shown in FIG. 5C, the lower electrode 121 is formed on the entire surface of the first silicon oxide layer 115 formed on the silicon substrate 112. As described above, the lower electrode 121 may be formed of two metal layers, that is, a titanium (Ti) layer 121a and a platinum (Pt) layer 121b. The Ti layer 121a can be formed by depositing Ti on the entire surface of the oxide layer 115 to a thickness of about 400 Å by sputtering. The Pt layer 121b can be formed by depositing Pt on the entire surface of the Ti layer 121a to a thickness of about 5,000 Å by sputtering.

Figure 5D:
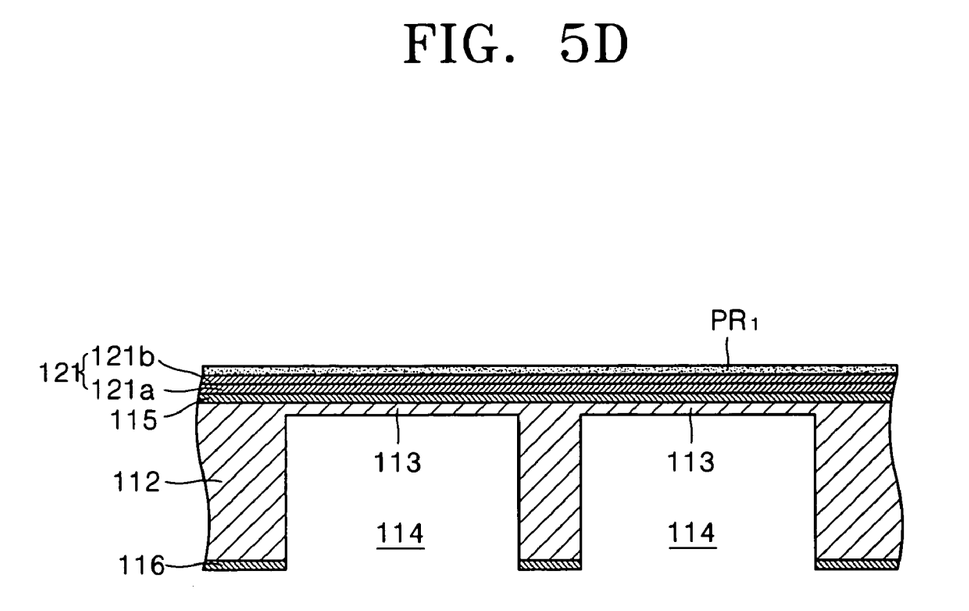
Figure 5E:
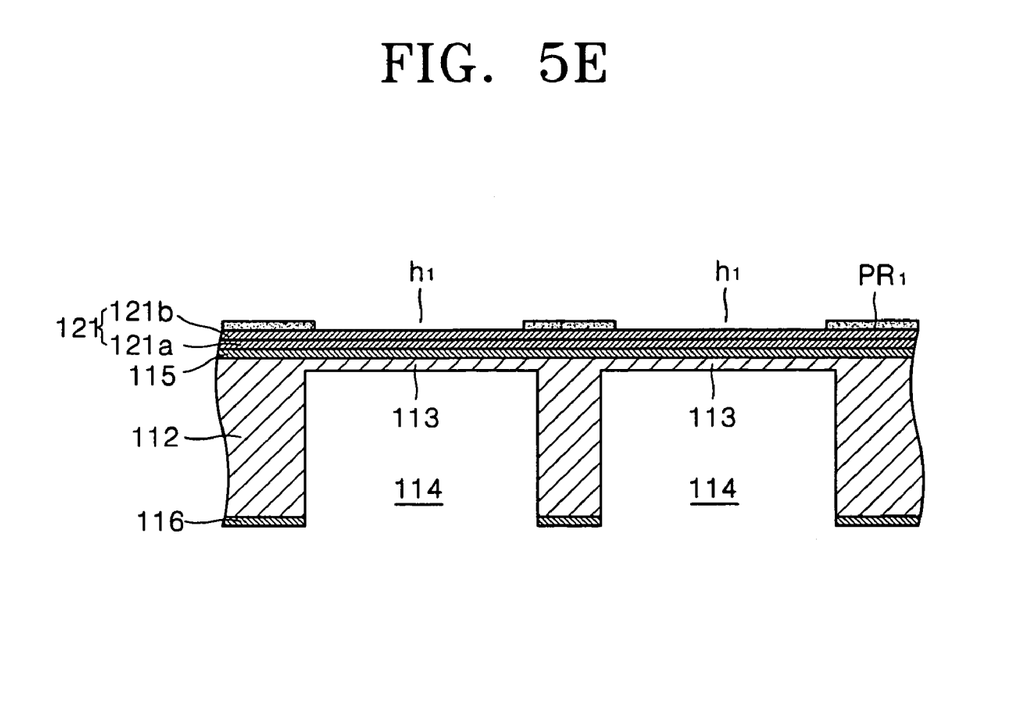

Next, as shown in FIG. 5D, a photoresist $PR_1$ is coated on the entire surface of the lower electrode 121 to a predetermined thickness, e.g., about 2 to 8 μm. Subsequently, the coated photoresist $PR_1$ is exposed and developed for patterning, thereby forming an opening $h_1$ in the photoresist having a width of about 70 to 90% of that of the pressure chamber 114 at a position corresponding to the pressure chamber 114, as shown in FIG. 5E. A portion of the lower electrode 121 is exposed through the opening $h_1$.

Figure 5F:
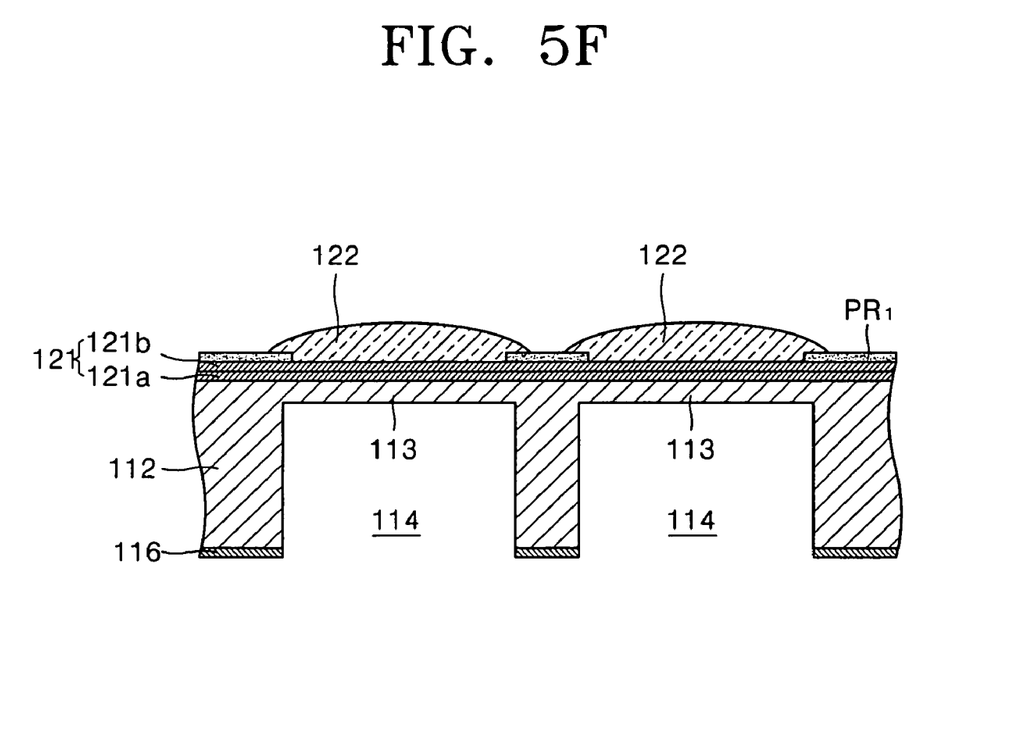

Subsequently, a piezoelectric material in a paste state is coated on the exposed lower electrode 121 slightly wider than the width of the opening $h_1$ by screen-printing, thereby forming a piezoelectric film 122 having a width greater than a width of the opening, as shown in FIG. 5F. Various materials, preferably lead zirconate titanate (PZT) ceramics, may be used for the piezoelectric material.

Figure 5G:
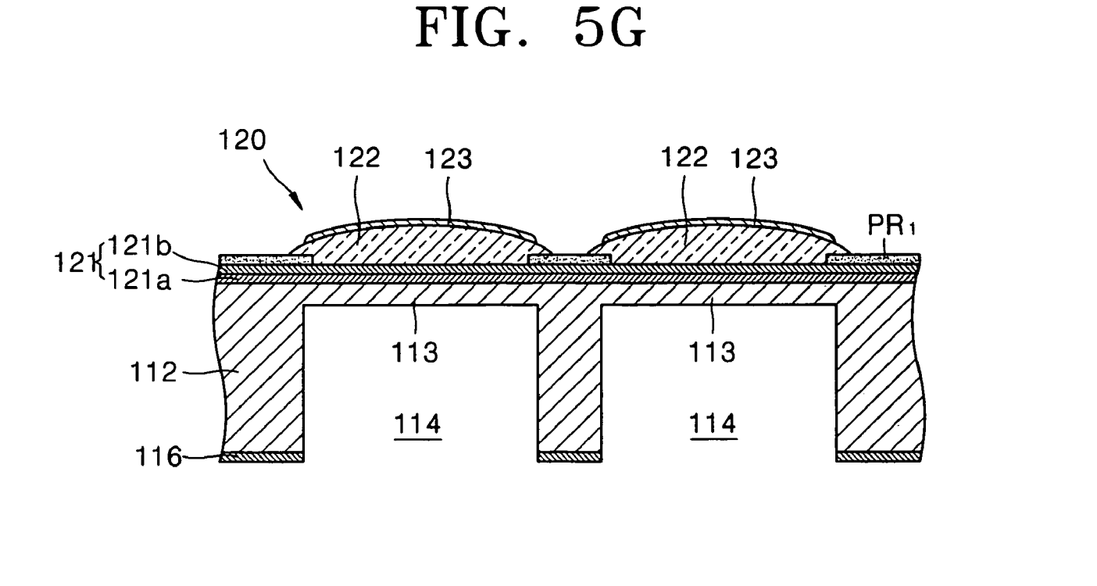

Subsequently, as shown in FIG. 5G, an upper electrode 123 is formed on the piezoelectric film 122. More specifically, an electrode material, for example, an Ag—Pd paste, may be printed on the piezoelectric film 122 to form the upper electrode 123. Alternatively, the upper electrode 123 may be formed by depositing a predetermined electrode material onto a surface of the piezoelectric film 122 to a predetermined thickness using a shadow mask by means of a sputterer, an evaporator or an E-beam irradiator. Then, the piezoelectric film 122 and the upper electrode 123 are dried at a predetermined temperature, for example, at about 100 to 110° C. for about 5 to 10 minutes.

Figure 5H:
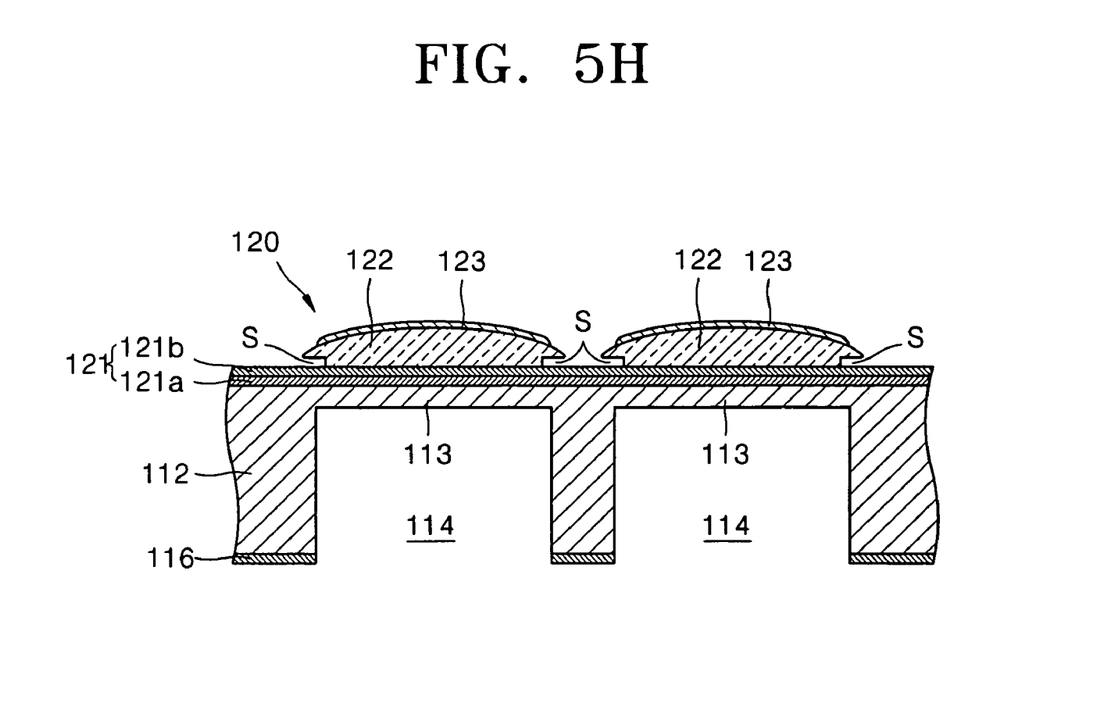

Next, the photoresist $PR_1$ is removed using acetone. Thus, a space S having a predetermined width and height is formed between either side of the piezoelectric film 122 and the lower electrode 121, as shown in FIG. 5H.

Finally, the piezoelectric film 122 is sintered at a predetermined temperature, for example, about 900 to about 1,000° C., followed by an application of an electric field to the piezoelectric film 122 to produce piezoelectric characteristics, which is called a polling process, thereby completing the piezoelectric actuator 120 according to the first embodiment of the present invention.

FIGS. 6A through 6E illustrate sequential steps of a method of forming the piezoelectric actuator shown in FIG. 3.

Figure 6A:
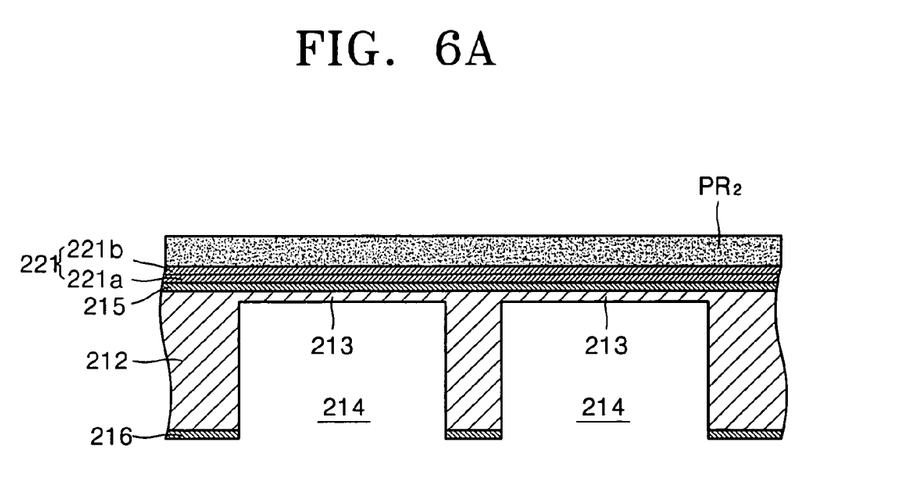
FIGS. 6A through 6E illustrate sequential steps of a method of forming the piezoelectric actuator shown in FIG. 3.

Referring to FIG. 6A, first and second oxide layers 215 and 216 are formed on a top surface and on a bottom surface of a substrate 212, respectively. A pressure chamber 214 and a vibration plate 213 are formed on the substrate 212. A lower electrode 221, including a Ti layer 221a and a Pt layer 221b, is formed on the first oxide layer 215. Steps followed to form the lower electrode 221 are the same as those shown of the method shown in FIGS. 5A through 5C, and description thereof will not be repeated.

Figure 6B:
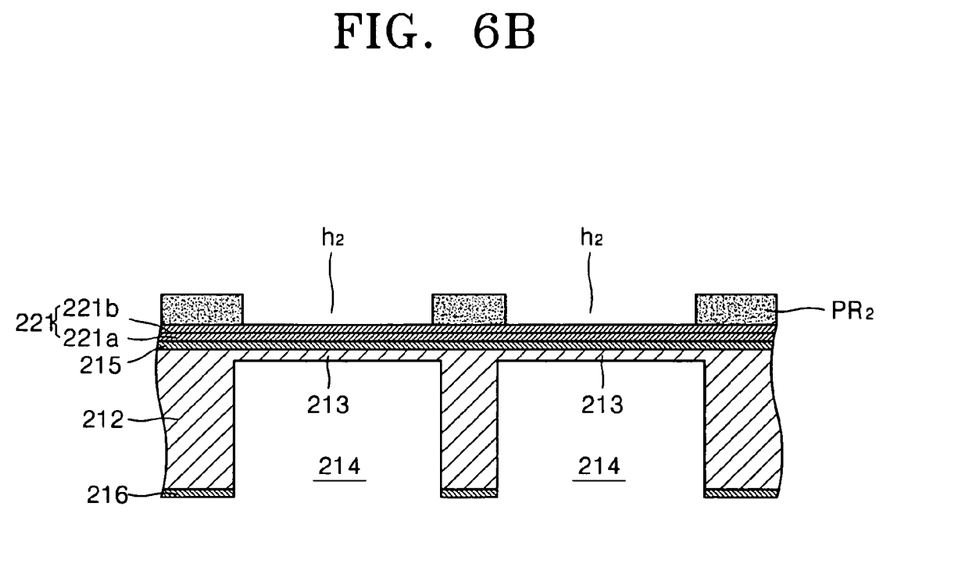

Subsequently, a photoresist $PR_2$ is coated on the entire surface of the lower electrode 221 to a predetermined thickness, e.g., about 20 to about 40 μm. Here, a thickness of the photoresist $PR_2$ coated is greater than that of the photoresist $PR_1$ shown in FIG. 5D. Then, the coated photoresist $PR_2$ is exposed and developed for patterning, thereby forming an opening $h_2$ having a width of about 70 to 90% of that of the pressure chamber 214 at a position corresponding to the pressure chamber 214, as shown in FIG. 6B. A portion of the lower electrode 221 is exposed through the opening $h_2$.

Figure 6C:
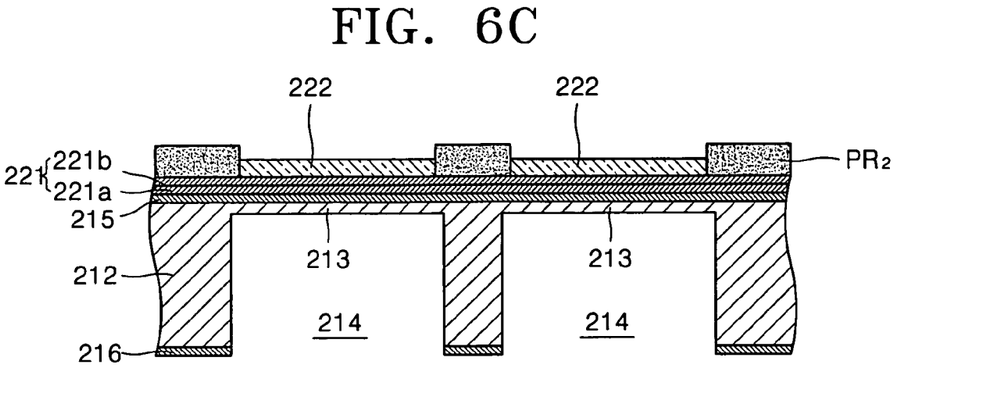

As shown in FIG. 6C, a piezoelectric material in a paste state is coated on the exposed lower electrode 221 by screen-printing. Here, the piezoelectric material should entirely remain in the opening $h_2$, i.e., the piezoelectric film 222 is formed only within the opening $h_2$. Similar to the method of the first embodiment, PZT ceramics may be used as the piezoelectric material.

Figure 6D:
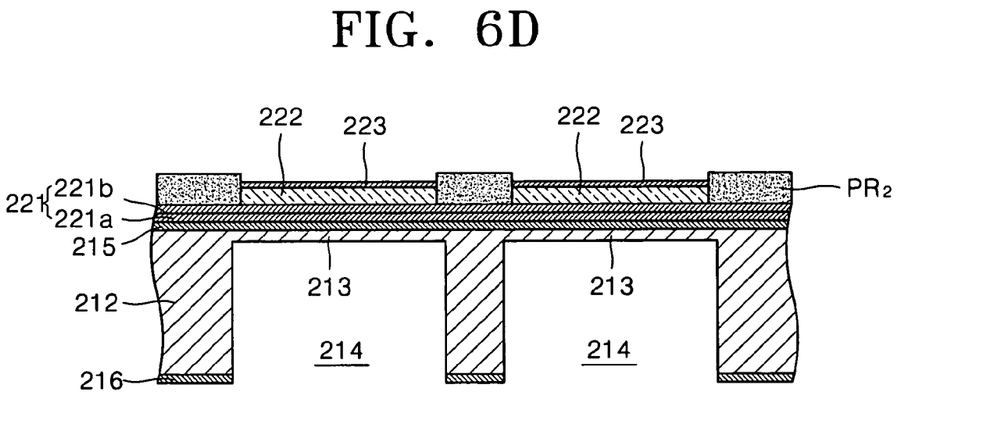

Next, as shown in FIG. 6D, an upper electrode 223 is formed on the piezoelectric film 222. The method for forming the upper electrode 223 is the same as described in FIG. 5G, except that the upper electrode 223 of the second embodiment is formed within the opening $h_2$, like the piezoelectric film 222. To this end, as described above, the photoresist $PR_2$ is preferably formed to have a relatively large height. Subsequently, the piezoelectric film 222 and the upper electrode 223 are dried at a temperature of about 100 to 110° C. for about 5 to 10 minutes.

Figure 6E:
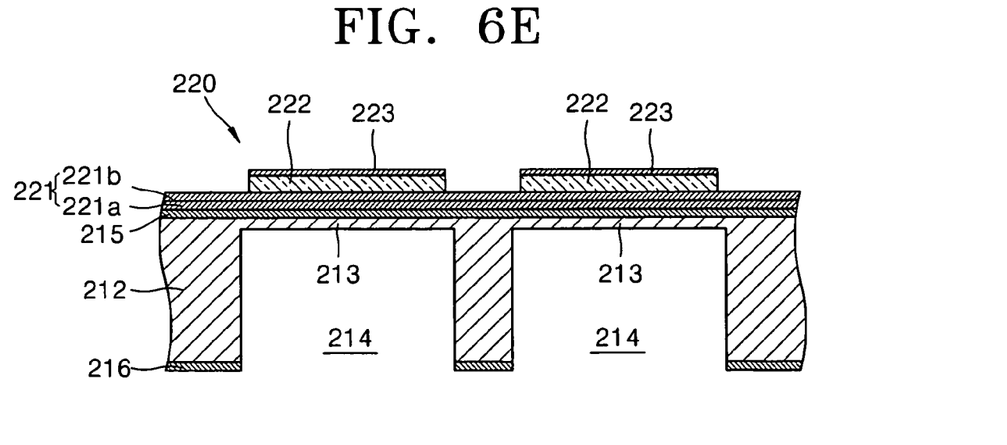

Subsequently, the photoresist $PR_2$ is removed using acetone. Thus, the piezoelectric film 222, which has a lateral surface substantially perpendicular to a top surface of the lower electrode 221, and the upper electrode 223 having a width substantially equal to a width of piezoelectric film 222, remain on the lower electrode 221, as shown in FIG. 6E.

Finally, the piezoelectric film 222 is sintered at a predetermined temperature, for example, about 900 to about 1,000° C., followed by an application of an electric field to the piezoelectric film 222 to produce piezoelectric characteristics, which is called a polling process, thereby completing the piezoelectric actuator 220 according to the second embodiment of the present invention.

Figure 7A:
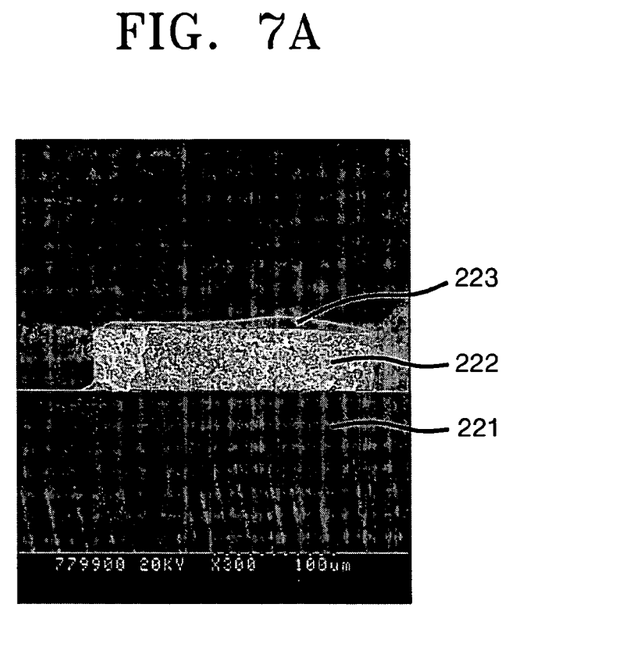
FIGS. 7A and 7B are scanning electron microscope pictures of the piezoelectric actuator formed by the method shown in FIGS. 6A through 6E.
Figure 7B:
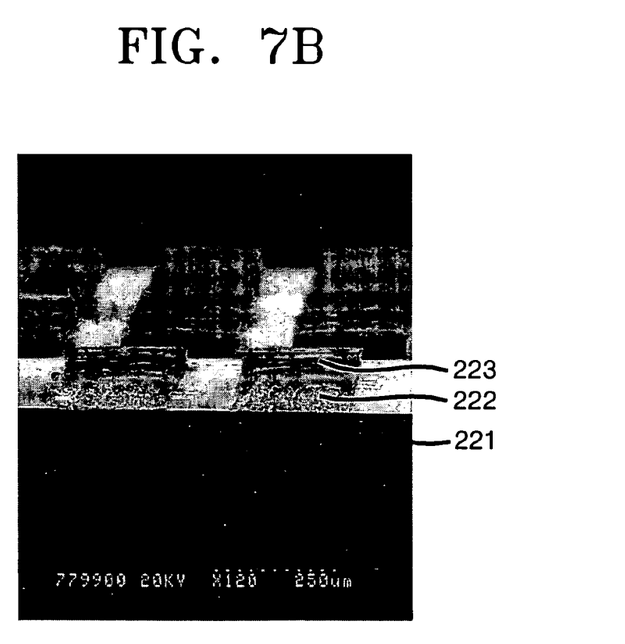

FIGS. 7A and 7B are scanning electron microscope (SEM) pictures of the piezoelectric actuator formed by the method shown in FIGS. 6A through 6E.

Referring to FIGS. 7A and 7B, the lateral surface of the piezoelectric film 222 forms substantially a right angle with respect to the top surface of the lower electrode 221. Further, the piezoelectric film 222 has a rectangular cross section having a substantially constant height. That is, the piezoelectric film 222 has a hexahedral shape.

As described above, the piezoelectric actuator for an ink-jet printhead according to the present invention and a forming method thereof have the following effects.

First, in a case where a space is formed between a lower electrode and a peripheral portion of a piezoelectric film, even if a relatively wide upper electrode is formed, a short between the upper electrode and the lower electrode does not occur. In addition, no breakdown of the piezoelectric film occurs during polling or driving. Therefore, sufficiently high piezoelectric effects can be produced.

Second, if a lateral surface of the piezoelectric film is substantially perpendicular to the top surface of the lower electrode, the piezoelectric film has a rectangular cross section. Thus, a width of the upper electrode can be made the same as that of the piezoelectric film, thereby allowing maximum piezoelectric effect to be produced for the same area. In addition, since a thickness of the piezoelectric film disposed below the upper electrode is constant, neither a short nor a breakdown of the piezoelectric film occurs. Further, since the piezoelectric film is formed relatively thinly, e.g., to a predetermined thickness, a minute piezoelectric actuator can be formed accurately and easily. Accordingly, the present invention can be suitably applied to a recent trend toward high-density printheads for high-resolution printing.

Preferred embodiments of the present invention have been disclosed herein and, although specific terms are employed, they are used and are to be interpreted in a generic and descriptive sense only and not for purpose of limitation. For example, the exemplary methods for forming elements suggested above are only provided by way of example and not limitation. Further, various deposition methods and etching methods may be employed within the scope of the present invention. Moreover, the sequence of the respective steps may vary from the above illustration. Accordingly, it will be understood by those of ordinary skill in the art that various changes in form and details may be made without departing from the spirit and scope of the present invention as set forth in the following claims.

What is claimed is:

1. A piezoelectric actuator for providing a driving force to a pressure chamber of an ink-jet printhead for ejecting ink by deforming a vibration plate, the vibration plate forming an upper wall of the pressure chamber, the piezoelectric actuator comprising:
    a lower electrode formed on the vibration plate;
    a piezoelectric film having protruding portions, the piezoelectric film being formed on the lower electrode at a position that corresponds to the pressure chamber, the protruding portions protruding from upper sidewall portions of the piezoelectric film such that an upper portion of the piezoelectric film has a wider width than a lower portion of the piezoelectric film; and
    an upper electrode formed on the piezoelectric film for applying a voltage to the piezoelectric film, wherein a space exists between a lower surface of the protruding portions and an upper surface of the lower electrode.

2. The piezoelectric actuator as claimed in claim 1, wherein the width of the lower portion of the piezoelectric film contacting the lower electrode is about 70% to about 90% of a width of the pressure chamber.

3. The piezoelectric actuator as claimed in claim 1, wherein the lower electrode comprises a two-layer structure in which a titanium (Ti) layer and a platinum (Pt) layer are sequentially stacked.

4. The piezoelectric actuator as claimed in claim 3, wherein the titanium (Ti) layer has a thickness of about 400 Å and the platinum (Pt) layer has a thickness of about 5000 Å.

5. The piezoelectric actuator as claimed in claim 1, wherein the vibration plate is made of silicon.

6. The piezoelectric actuator as claimed in claim 5, further comprising a silicon oxide layer between the vibration plate and the lower electrode.

7. The piezoelectric actuator as claimed in claim 1, wherein the space has a thickness of about 2 to about 8 μm along a direction substantially perpendicular to a plane along which the lower electrode extends.

8. The piezoelectric actuator as claimed in claim 1, wherein the piezoelectric film has a substantially T-shaped cross-sectional shape.

9. The piezoelectric actuator as claimed in claim 1, wherein the piezoelectric film includes lead zirconate titanate.

10. The piezoelectric actuator as claimed in claim 1, wherein the protruding portions of the piezoelectric film extend away from the upper sidewall portions of the piezoelectric film along a direction substantially parallel to a direction along which the lower electrode extends.

11. The piezoelectric actuator as claimed in claim 1, wherein a lower sidewall portion of the piezoelectric actuator extends substantially perpendicular to a direction along which the lower electrode extends.

12. The piezoelectric actuator as claimed in claim 11, wherein the lower sidewall portion and the lower surface of a corresponding one of the protruding portions extend substantially perpendicular to each other.

13. The piezoelectric actuator as claimed in claim 1, wherein:
  the lower portion of the piezoelectric film has a substantially uniform thickness, and
  a substantially central portion of the upper portion of the piezoelectric film has a larger thickness than peripheral portions of the upper portion of the piezoelectric film.

14. The piezoelectric actuator as claimed in claim 13, wherein an upper surface of the piezoelectric film is curved.

15. A piezoelectric actuator for providing a driving force to a pressure chamber of an ink-jet printhead for ejecting ink by deforming a vibration plate, the vibration plate forming an upper wall of the pressure chamber, the piezoelectric actuator comprising:
  a lower electrode formed on the vibration plate;
  a piezoelectric film having protruding portions, the piezoelectric film being formed on the lower electrode at a position that corresponds to the pressure chamber, the protruding portions protruding from upper sidewall portions of the piezoelectric film such that an upper portion of the piezoelectric film has a wider width than a lower portion of the piezoelectric film; and
  an upper electrode formed on the piezoelectric film for applying a voltage to the piezoelectric film, wherein the protruding portions of the piezoelectric film extend away from the upper sidewall portions of the piezoelectric film along a direction substantially parallel to a direction along which the lower electrode extends.

* * * * *